United States Patent
Hsiao

(10) Patent No.: US 11,643,514 B2
(45) Date of Patent: May 9, 2023

(54) POLYIMIDE FILMS AND ELECTRONIC DEVICES

(71) Applicant: DUPONT ELECTRONICS, INC., Wilmington, DE (US)

(72) Inventor: Ming-Siao Hsiao, Centerville, OH (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 13 days.

(21) Appl. No.: 17/471,080

(22) Filed: Sep. 9, 2021

(65) Prior Publication Data

US 2022/0340722 A1    Oct. 27, 2022

Related U.S. Application Data

(60) Provisional application No. 63/178,718, filed on Apr. 23, 2021.

(51) Int. Cl.
| | | |
|---|---|---|
| *C08J 5/18* | (2006.01) | |
| *C08G 73/10* | (2006.01) | |
| *H01L 27/12* | (2006.01) | |
| *H05K 1/03* | (2006.01) | |

(52) U.S. Cl.
CPC ............ *C08J 5/18* (2013.01); *C08G 73/1042* (2013.01); *C08G 73/1053* (2013.01); *C08G 73/1071* (2013.01); *C08J 2379/08* (2013.01); *H01L 27/1218* (2013.01); *H05K 1/0346* (2013.01); *H05K 2201/0154* (2013.01)

(58) Field of Classification Search
CPC ............ C08G 73/1042; C08G 73/1053; C08G 73/1067; C08G 73/1071; C08G 73/1085; C08J 2379/08; C08J 5/18; H01L 27/1218; H05K 1/0346; H05K 2201/0154
See application file for complete search history.

(56) References Cited

U.S. PATENT DOCUMENTS

| | | |
|---|---|---|
| 2,801,185 A | 5/1952 | Iler |
| 4,522,958 A | 6/1985 | Das et al. |
| 4,742,099 A | 5/1988 | Nagano et al. |
| 5,218,034 A | 6/1993 | Milligan et al. |
| 5,227,244 A | 7/1993 | Milligan |
| 5,298,331 A | 3/1994 | Kanakarajan et al. |
| 5,543,222 A | 8/1996 | Edman et al. |
| 5,648,407 A | 7/1997 | Goetz et al. |
| 6,770,733 B2 | 8/2004 | Zuo et al. |

FOREIGN PATENT DOCUMENTS

| | | |
|---|---|---|
| CN | 106928481 A | 7/2017 |
| JP | 4031624 B2 | 1/2008 |
| JP | 4406921 B2 | 2/2010 |
| JP | 2018-104525 A | 7/2018 |
| KR | 20110035620 A | 4/2011 |

OTHER PUBLICATIONS

S. Wang et al., "Synthesis and Characterization of Thermally Stable, High-Modulus Polyimides Containing Benzimidazole Moieties," J. Polym. Sol. Polym. Chem. (2009), 47(8), pp. 2024-2031.

*Primary Examiner* — Lawrence D Ferguson

(57) ABSTRACT

In a first aspect, a polyimide film includes a polyimide derived from a dianhydride and a diamine. The dianhydride includes pyromellitic dianhydride, the diamine includes a benzimidazole, the molar ratio of dianhydride to diamine that forms the polyimide is in a range of from 0.85:1 to 0.99:1, and the polyimide film has a $T_g$ of 400° C. or higher, a tensile modulus of 6.0 GPa or more, and a coefficient of thermal expansion of 15 ppm/° C. or less over a temperature range of 50 to 500° C. In a second aspect, an electronic device includes the polyimide film of the first aspect.

10 Claims, No Drawings

POLYIMIDE FILMS AND ELECTRONIC DEVICES

FIELD OF DISCLOSURE

The field of this disclosure is polyimide films, electronic devices and polyamic acid solutions.

BACKGROUND OF THE DISCLOSURE

Polymer films having high temperature stability, high tensile modulus and low coefficient of thermal expansion (CTE) are needed for flexible display applications, such as for thin-film transistor (TFT) substrates in organic light-emitting diode (OLED) displays, electronic paper (E-paper) and touch sensor panels (TSPs) for displays. For example, aromatic polyimides are typically very thermally stable, with glass transition temperatures ($T_g$) of greater than 320° C., and have excellent foldability and rollability, making them ideal candidates for use in various layers of flexible display devices, such as touch sensor panels and cover windows. But for flexible TFT substrates, in addition to good bending properties, TFT manufacturing processes require films that are stable at temperatures of 400° C. or higher for extended periods of time, while also having low CTE's and maintaining high tensile moduli.

Polymer fibers containing benzimidazole can exhibit high strength, high glass transition temperature ($T_g$), and low CTE due to the introduction of intramolecular hydrogen-bonding in the main polymer chain, forming highly oriented, well-ordered dense-packing molecular structures in the fiber. Polybenzimidazole (PBI) is an extremely heat resistant heterocyclic polymer. With a $T_g$ of about 430° C., it shows superior dimensional stability, retention of stiffness and toughness at temperatures over 400° C. and has been widely used in the aerospace/defense industry, in fire-fighting equipment, and as the membrane in fuel cells in the form of fiber or resin. PBI also has a higher modulus and is stronger than typical polyimides. Polyimide films containing a benzimidazole-based diamine, such as 5-amino-2-(4-aminophenyl)benzimidazole (DAPBI), can possess outstanding thermal and oxidative stability under extreme conditions while maintaining good mechanical properties. However, the strong hydrogen-bonding interaction introduced by benzimidazoles can also present challenges in processing polyamic acid solutions used to make polyimide films. For example, a robust roll-to-roll film-making process for polyimide films requires good control of the viscosity and solids content of the liquid polyamic acid solutions to enable a commercially sustainable process. U.S. Pat. No. 6,770,733 B2 describes a film-formable polyimide copolymer having a benzimidazole, where the dianhydride used for the polyimide is a combination of pyromellitic dianhydride (PMDA) and 3,3',4,4'-benzophenone tetracarboxylic acid dianhydride (BTDA). When trying to use PMDA, without any BTDA, as the sole dianhydride for the polymer, however, it is not possible to form a film. A similar effort to make robust polyimide films (S. Wang et al., *J. Polym. Sci. Polym. Chem.* (2009), 47(8), 2024-2031) shows that using only PMDA and DAPBI as the dianhydride and diamine monomers is problematic due to the rigid nature of the polymer backbone. More recent efforts to make PMDA//DAPBI polyimide films (Chinese Patent Application Publication No. CN106928481 A and Japanese Patent Application Publication No. JP2018-104525 A) describe processes to carefully handle low solids, low viscosity polyamic acid solutions to make polyimide films that have high $T_g$ (>400° C.), but these polyimide films are fragile and brittle, preventing the inventors from performing mechanical tests on these samples.

There remains a need for robust polymer films with high $T_g$, low CTE and high tensile modulus that can be used in flexible device applications.

SUMMARY

In a first aspect, a polyimide film includes a polyimide derived from a dianhydride and a diamine. The dianhydride includes pyromellitic dianhydride, the diamine includes a benzimidazole, the molar ratio of dianhydride to diamine that forms the polyimide is in a range of from 0.85:1 to 0.99:1, and the polyimide film has a $T_g$ of 400° C. or higher, a tensile modulus of 6.0 GPa or more, and a coefficient of thermal expansion of 15 ppm/° C. or less over a temperature range of 50 to 500° C.

In a second aspect, an electronic device includes the polyimide film of the first aspect.

In a third aspect, a polyamic acid solution includes a dianhydride and a diamine. The dianhydride includes pyromellitic dianhydride, the diamine includes a benzimidazole, the molar ratio of dianhydride monomer to diamine monomer is in a range of from 0.85:1 to 0.99:1, and the polyamic acid solution has a solids content in a range of from 10 to 25 weight percent and a viscosity in a range of from 300 to 3000 poise.

The foregoing general description and the following detailed description are exemplary and explanatory only and are not restrictive of the invention, as defined in the appended claims.

DETAILED DESCRIPTION

In a first aspect, a polyimide film includes a polyimide derived from a dianhydride and a diamine. The dianhydride includes pyromellitic dianhydride, the diamine includes a benzimidazole, the molar ratio of dianhydride to diamine that forms the polyimide is in a range of from 0.85:1 to 0.99:1, and the polyimide film has a $T_g$ of 400° C. or higher, a tensile modulus of 6.0 GPa or more, and a coefficient of thermal expansion of 15 ppm/° C. or less over a temperature range of 50 to 500° C.

In one embodiment of the first aspect, the dianhydride further includes up to 70 mole percent of 3,3',4,4'-biphenyltetracarboxylic dianhydride, 2,3,3',4'-biphenyltetracarboxylic dianhydride, or a mixture thereof, based on the total dianhydride content of the polyimide.

In another embodiment of the first aspect, the benzimidazole is selected from the group consisting of 5-amino-2-(4-aminophenyl)benzimidazole, 5-amino-2-(3-aminophenyl)benzimidazole, 6,6'-bis[2-(4-aminobenzene)benzimidazole], [2,2'-bi-1H-benzimidazole]-6,6'-diamine and mixtures thereof.

In yet another embodiment of the first aspect, the diamine further includes a benzoxazole. In a specific embodiment, the benzoxazole is selected from the group consisting of 5-amino-2-(4-aminophenyl)benzoxazole, 2,2'-p-phenylenebis[5-aminobenzoxazole], [2,2'-bibenzoxazole]-5,5'-diamine, 2,6-(4,4'-aminophenyl)benzobisoxazole and mixtures thereof.

In still another embodiment of the first aspect, the diamine further includes up to 50 mole percent of p-phenylenediamine, m-phenylenediamine, m-tolidine, or a mixture thereof, based on the total diamine content of the polyimide.

In still yet another embodiment of the first aspect, the polyimide film further includes a crosslinking agent, a colorant, a matting agent, submicron particles or a mixture thereof.

In a further embodiment of the first aspect, the polyimide film has a thickness in a range of from 4 to 150 µm.

In a second aspect, an electronic device includes the polyimide film of the first aspect. In a specific embodiment, the polyimide film is used in device components selected from the group consisting of thin-film transistor substrates, substrates for color filter sheets, cover films and metal-clad laminates.

In a third aspect, a polyamic acid solution includes a dianhydride and a diamine. The dianhydride includes pyromellitic dianhydride, the diamine includes a benzimidazole, the molar ratio of dianhydride monomer to diamine monomer is in a range of from 0.85:1 to 0.99:1, and the polyamic acid solution has a solids content in a range of from 10 to 25 weight percent and a viscosity in a range of from 300 to 3000 poise.

In one embodiment of the third aspect, the dianhydride further includes up to 70 mole percent of 3,3',4,4'-biphenyltetracarboxylic dianhydride, 2,3,3',4'-biphenyltetracarboxylic dianhydride, or a mixture thereof, based on the total dianhydride content of the polyimide.

In another embodiment of the third aspect, the benzimidazole is selected from the group consisting of 5-amino-2-(4-aminophenyl)benzimidazole, 5-amino-2-(3-aminophenyl)benzimidazole, 6,6'-bis[2-(4-aminobenzene) benzimidazole], [2,2'-bi-1H-benzimidazole]-6,6'-diamine and mixtures thereof.

In yet another embodiment of the third aspect, the diamine further includes a benzoxazole. In a specific embodiment, the benzoxazole is selected from the group consisting of 5-amino-2-(4-aminophenyl)benzoxazole, 2,2'-p-phenylenebis[5-aminobenzoxazole], [2,2'-bibenzoxazole]-5,5'-diamine, 2,6-(4,4'-aminophenyl)benzobisoxazole and mixtures thereof.

In still another embodiment of the third aspect, the diamine further includes up to 50 mole percent of p-phenylenediamine, m-phenylenediamine, m-tolidine, or a mixture thereof, based on the total diamine content of the polyimide.

In still yet another embodiment of the third aspect, the polyamic acid solution further includes a crosslinking agent, a colorant, a matting agent, submicron particles or a mixture thereof.

Many aspects and embodiments have been described above and are merely exemplary and not limiting. After reading this specification, skilled artisans appreciate that other aspects and embodiments are possible without departing from the scope of the invention. Other features and advantages of the invention will be apparent from the following detailed description, and from the claims.

In one embodiment, a polyamic acid (PAA) solution having both pyromellitic dianhydride and a benzimidazole-based diamine can be used to form a polyimide film with a high $T_g$, a low CTE and a high tensile modulus. The PAA solution can have a high solids content and high viscosity. By adjusting the molecular ratio of the dianhydride to diamine monomers in the PAA, good control over the film-forming process enables the production of robust polyimide films, making it possible to use roll-to-roll processing to form continuous, free-standing polyimide film. In one embodiment, the PAA solution can be cast on copper foil to form copper-clad laminates. In one embodiment, the polyimide film has a $T_g$ of 400° C. or higher, a tensile modulus of 6.0 GPa or more, and a coefficient of thermal expansion of 15 ppm/° C. or less over a temperature range of 50 to 500° C. In one embodiment, the polyamic acid solution has a solids content in a range of from 10 to 25 wt % and a viscosity in a range of from 300 to 3000 poise. In one embodiment, the molar ratio of dianhydride monomer to diamine monomer is in a range of from 0.85:1 to 0.99:1. These flexible polyimide films can be used for numerous applications in the electronics industry where the benefits of their high $T_g$ (glass transition temperature), high tensile modulus and low CTE (the coefficient of thermal expansion) are desired, such as for TFT substrates and E-paper, as well as in the manufacture of flexible circuits and copper clad laminates, and in display devices, such as for cover windows, touch sensor panels and other electronic device layers.

Depending upon context, "diamine" as used herein is intended to mean: (i) the unreacted form (i.e., a diamine monomer); (ii) a partially reacted form (i.e., the portion or portions of an oligomer or other polymer precursor derived from or otherwise attributable to diamine monomer) or (iii) a fully reacted form (the portion or portions of the polymer derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the term "dianhydride" as used herein is intended to mean the component that reacts with (is complimentary to) the diamine and in combination is capable of reacting to form an intermediate (which can then be cured into a polymer). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polymer composition reacted from or otherwise attributable to dianhydride monomer) or (iii) a fully reacted form (the portion or portions of the polymer derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polymer). Such additional anhydride moieties could be used to crosslink the polymer or to provide other functionality to the polymer.

Although methods and materials similar or equivalent to those described herein can be used in the practice or testing of the present invention, suitable methods and materials are described herein.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In describing certain polymers, it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers or that amount of the monomers, and the corresponding polymers and compositions thereof.

The materials, methods, and examples herein are illustrative only and, except as specifically stated, are not intended to be limiting. As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Organic Solvents

Useful organic solvents for the synthesis of the polymers of the present invention are preferably capable of dissolving the polymer precursor materials. Such a solvent should also have a relatively low boiling point, such as below 225° C., so the polymer can be dried at moderate (i.e., more convenient and less costly) temperatures. A boiling point of less than 210, 205, 200, 195, 190, or 180° C. is preferred.

Useful organic solvents include: N-methylpyrrolidone (NMP), dimethylacetamide (DMAc), methyl ethyl ketone (MEK), N,N'-dimethyl-formamide (DMF), dimethyl sulfoxide (DMSO), tetramethyl urea (TMU), glycol ethyl ether, diethyleneglycol diethyl ether, 1,2-dimethoxyethane (monoglyme), diethylene glycol dimethyl ether (diglyme), 1,2-bis-(2-methoxyethoxy) ethane (triglyme), gamma-butyrolactone, and bis-(2-methoxyethyl) ether, tetrahydrofuran (THF), ethyl acetate, hydroxyethyl acetate glycol monoacetate, acetone and mixtures thereof. In one embodiment, preferred solvents include N-methylpyrrolidone (NMP) and dimethylacetamide (DMAc).

Diamines

In one embodiment a suitable diamine for forming the polyimide film includes a benzimidazole. Examples of suitable benzimidazoles include 5-amino-2-(4-aminophenyl) benzimidazole (DAPBI), 5-amino-2-(3-aminophenyl)benzimidazole (i-DAPBI), 6,6'-bis[2-(4-aminobenzene) benzimidazole] and [2,2'-bi-1H-benzimidazole]-6,6'-diamine. In one embodiment the suitable diamine further includes a benzoxazole, such as 5-amino-2-(4-aminophenyl) benzoxazole (DAPBO), 2,2'-p-phenylenebis[5-aminobenzoxazole], [2,2'-bibenzoxazole]-5,5'-diamine and 2,6-(4,4'-aminophenyl)benzobisoxazole.

In one embodiment, up to 50 mole percent of one or more additional diamines (based on the total diamine content of the polyamic acid solution or polyimide) can also be used.

In one embodiment, a suitable additional diamine for forming the polyimide film can include an aliphatic diamine, such as 1,2-diaminoethane, 1,6-diaminohexane, 1,4-diaminobutane, 1,5 diaminopentane, 1,7-diaminoheptane, 1,8-diaminooctane, 1,9-diaminononane, 1,10-diaminodecane (DMD), 1,11-diaminoundecane, 1,12-diaminododecane (DDD), 1,16-hexadecamethylenediamine, 1,3-bis(3-aminopropyl)-tetramethyldisiloxane, and combinations thereof. Other aliphatic diamines suitable for practicing the invention include those having six to twelve carbon atoms or a combination of longer chain and shorter chain diamines so long as both developability and flexibility are maintained. Long chain aliphatic diamines may increase flexibility.

In one embodiment, a suitable additional diamine for forming the polyimide film can include an alicyclic diamine (can be fully or partially saturated), such as a cyclobutane diamine (e.g., cis- and trans-1,3-diaminocyclobutane, 6-amino-3-azaspiro[3.3]heptane, and 3,6-diaminospiro[3.3] heptane), bicyclo[2.2.1]heptane-1,4-diamine, isophoronediamine, and bicyclo[2.2.2]octane-1,4 diamine. Other alicyclic diamines can include cis-1,4 cyclohexane diamine, trans-1,4 cyclohexane diamine, 1,4-bis(aminomethyl)cyclohexane, 4,4'-methylenebis(cyclohexylamine), 4,4'-methylenebis(2-methyl-cyclohexylamine), bis(aminomethyl)norbornane.

In one embodiment, a suitable additional diamine for forming the polyimide film can further include a fluorinated aromatic diamine, such as 2,2'-bis(trifluoromethyl) benzidine (TFMB), trifluoromethyl-2,4-diaminobenzene, trifluoromethyl-3,5-diaminobenzene, 2,2'-bis-(4-aminophenyl)-hexafluoro propane, 4,4'-diamino-2,2'-trifluoromethyl diphenyloxide, 3,3'-diamino-5,5'-trifluoromethyl diphenyloxide, 9.9'-bis(4-aminophenyl)fluorene, 4,4'-trifluoromethyl-2,2'-diaminobiphenyl, 4,4'-oxy-bis-[2-trifluoromethyl)benzene amine] (1,2,4-OBABTF), 4,4'-oxy-bis-[3-trifluoromethyl)benzene amine], 4,4'-thio-bis-[(2-trifluoromethyl)benzene-amine], 4,4'-thiobis[(3-trifluoromethyl)benzene amine], 4,4'-sulfoxyl-bis-[(2-trifluoromethyl)benzene amine, 4,4'-sulfoxyl-bis-[(3-trifluoromethyl)benzene amine], 4,4'-keto-bis-[(2-trifluoromethyl)benzene amine], 1,1-bis[4'-(4"-amino-2"-trifluoromethylphenoxy)phenyl]cyclopentane, 1,1-bis[4'-(4"-amino-2"-trifluoromethylphenoxy)phenyl]cyclohexane, 2-trifluoromethyl-4,4'-diaminodiphenyl ether; 1,4-(2'-trifluoromethyl-4',4"-diaminodiphenoxy)-benzene, 1,4-bis(4'-aminophenoxy)-2-[(3',5'-ditrifluoromethyl)phenyl]benzene, 1,4-bis[2'-cyano-3'("4-amino phenoxy)phenoxy]-2-[(3',5'-ditrifluoro-methyl)phenyl]benzene (6FC-diamine), 3,5-diamino-4-methyl-2',3',5',6'-tetrafluoro-4'-tri-fluoromethyldiphenyloxide, 2,2-Bis[4'(4"-aminophenoxy)phenyl] phthalein-3',5'-bis(trifluoromethyl)anilide (6FADAP) and 3,3',5,5'-tetrafluoro-4,4'-diamino-diphenylmethane (TFDAM). In a specific embodiment, the fluorinated diamine is 2,2'-bis(trifluoromethyl) benzidine (TFMB).

In one embodiment, any number of additional diamines can be used in forming the polyimide film, including p-phenylenediamine (PPD), m-phenylenediamine (MPD), m-tolidine (m-TB), 2,5-dimethyl-1,4-diaminobenzene, 2,5-dimethyl-1,4-phenylenediamine (DPX), 2,2-bis-(4-aminophenyl) propane, 1,4-naphthalenediamine, 1,5-naphthalenediamine, 4,4'-diaminobiphenyl, 4,4'-diamino terphenyl, 4,4'-diamino benzanilide, 4,4'-diaminophenyl benzoate, 4,4'-diaminobenzophenone, 4,4'-diaminodiphenylmethane (MDA), 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether (ODA), 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl) methylamine, 1,5-diaminonaphthalene, 3,3'-dimethyl-4,4'-diaminobiphenyl, m-amino benzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, and p-xylylene diamine.

Other useful diamines include 1,2-bis-(4-aminophenoxy) benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy]phenyl) propane (BAPP), 2,2'-bis-(4-phenoxy aniline) isopropylidene, 2,4,6-trimethyl-1,3-diaminobenzene and 2,4,6-trimethyl-1,3-diaminobenzene.

Dianhydrides

In one embodiment, a suitable dianhydride for forming the polyimide film includes pyromellitic dianhydride (PMDA). In one embodiment, up to 70 mole percent of one or more additional dianhydrides (based on the total dianhydride content of the polyamic acid solution or polyimide) can also be used. For instance, any number of suitable additional dianhydrides can be used in forming the polyimide film. The dianhydrides can be used in their tetra-acid form (or as mono, di, tri, or tetra esters of the tetra acid), or as their diester acid halides (chlorides). However, in some embodiments, the dianhydride form can be preferred, because it is generally more reactive than the acid or the ester.

Examples of suitable additional dianhydrides include 3,3',4,4'-biphenyltetracarboxylic dianhydride (s-BPDA), 2,3,3',4'-biphenyltetracarboxylic dianhydride (a-BPDA), 2,2',3,3'-biphenyltetracarboxylicdianhydride (i-BPDA), 1,2,5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 3,3',4,4'-benzophenone tetracarboxylic dianhydride (BTDA), 2,2',3,3'-biphenyltetracarboxylic dianhydride, 2,3,3',4'-biphenyltetracarboxylic dianhydride, bicyclo-[2,2,2]-octen-(7)-2,3,5,6-tetracarboxylic-2,3,5,6-dianhydride, 4,4'-thio-diphthalic anhydride, bis (3,4-dicarboxyphenyl) sulfone dianhydride, bis (3,4-dicarboxyphenyl) sulfoxide dianhydride (DSDA), bis (3,4-dicarboxyphenyl oxadiazole-1,3,4) p-phenylene dianhydride, bis (3,4-dicarboxyphenyl) 2,5-oxadiazole 1,3,4-dianhydride, bis 2,5-(3',4'-dicarboxydiphenylether) 1,3,4-oxadiazole dianhydride, 4,4'-oxydiphthalic anhydride (ODPA), bis (3,4-dicarboxyphenyl) thio ether dianhydride, bisphenol A dianhydride (BPADA), bisphenol S dianhydride, bis-1,3-isobenzofurandione, 1,4-bis(4,4'-oxyphthalic anhydride) benzene, bis (3,4-dicarboxyphenyl) methane dianhydride, cyclopentadienyl tetracarboxylic dianhydride, ethylene tetracarboxylic dianhydride, perylene 3,4,9,10-tetracarboxylic dianhydride, tetrahydrofuran tetracarboxylic dianhydride, 1,3-bis-(4,4'-oxydiphthalic anhydride) benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride and thiophene-2,3,4,5-tetracarboxylic dianhydride.

In one embodiment, a suitable additional dianhydride can include an alicyclic dianhydride, such as cyclobutane-1,2,3,4-tetracarboxylic diandydride (CBDA), 1,2,4,5-cyclohexanetetracarboxylic dianhydride, 1,2,3,4-cyclohexanetetracarboxylic dianhydride, 1,2,3,4-tetramethyl-1,2,3,4-cyclobutanetetracarboxylic dianhydride, 1,2,3,4-cyclopentanetetracarboxylic dianhydride (CPDA), hexahydro-4,8-ethano-1H,3H-benzo[1,2-c:4,5-c']difuran-1,3,5,7-tetrone (BODA), 3-(carboxymethyl)-1,2,4-cyclopentanetricarboxylic 1,4:2,3-dianhydride (TCA), and meso-butane-1,2,3,4-tetracarboxylic dianhydride. In one embodiment, an alicyclic dianhydride can be present in an amount of about 70 mole percent or less, based on the total dianhydride content of the polyimide.

In one embodiment, a suitable additional dianhydride for forming the polyimide film can include a fluorinated dianhydride, such as 4,4'-(hexafluoroisopropylidene)diphthalic anhydride (6FDA) and 9,9-bis (trifluoromethyl)-2,3,6,7-xanthene tetracarboxylic dianhydride. In a specific embodiment, the fluorinated dianhydride is 4,4'-(hexafluoroisopropylidene)diphthalic anhydride (6FDA).

Crosslinking Agents

In one embodiment, crosslinking agents are used to make the polymer film. By crosslinking the polyimide, the polymer film may have improved mechanical properties, as well as improved chemical resistance. Crosslinking agents can include polyetheramines, such as Jeffamine® D-230, Jeffamine® D-400, Jeffamine® D-2000, Jeffamine® D-2010, Jeffamine® D-4000, Jeffamine® ED-600, Jeffamine® ED-900, Jeffamine® D-2003, Jeffamine® EDR-148, Jeffamine® THF-100, Jeffamine® THF-170, Jeffamine® SD-2001, Jeffamine® D-205 and Jeffamine® RFD-270, secondary amines, such as piperazine, N,N'-diisopropylethylenediamine, N,N'-diisopropyl-1,3-propanediamine and N,N'-dimethyl-1,3-propanediamine, and triamines, such as 2,4,6-triaminopyrimidine (TAP), melamine, diethylenetriamine, Jeffamine® T-403, Jeffamine® T-3000, Jeffamine® T-5000. In addition, many diamines that may be used as a diamine monomer for polyimides, as described above, may also be useful as crosslinking agents. In one embodiment, the polyamic acid solution contains up to 10 mole percent of a crosslinking agent, based on a composition with 100 mole percent of diamine and 85 to 99 mole percent of dianhydride. After imidization of the polyamic acid to form the polyimide film, some or all of the crosslinking agent may still remain in the polyimide film. In one embodiment the polyimide film contains up to 10 mole percent of a crosslinking agent, based on a composition with 100 mole percent of diamine and 85 to 99 mole percent of dianhydride.

Colorants

In one embodiment, the polyimide film contains 1 to 40 wt % of a colorant, such as a pigment or dye. In some embodiments, the polyimide film contains 1 to 40 wt % of a mixture of pigments and dyes. In some embodiments, the polyimide film contains between and including any two of the following: 1, 5, 10, 15, 20, 25, 30, 35 and 40 wt % colorant.

Virtually any pigment (or combination of pigments) can be used in the performance of the present invention. In some embodiments, useful pigments include but are not limited to the following: Barium Lemon Yellow, Cadmium Yellow Lemon, Cadmium Yellow Lemon, Cadmium Yellow Light, Cadmium Yellow Middle, Cadmium Yellow Orange, Scarlet Lake, Cadmium Red, Cadmium Vermilion, Alizarin Crimson, Permanent Magenta, Van Dyke brown, Raw Umber Greenish, or Burnt Umber. In some embodiments, useful black pigments include: cobalt oxide, Fe—Mn—Bi black, Fe—Mn oxide spinel black, $(Fe,Mn)_2O_3$ black, copper chromite black spinel, lampblack, bone black, bone ash, bone char, hematite, black iron oxide, micaceous iron oxide, black complex inorganic color pigments (CICP), $(Ni,Mn,Co)(Cr,Fe)_2O_4$ black, Aniline black, Perylene black, Anthraquinone black, Chromium Green-Black Hematite, Chrome Iron Oxide, Pigment Green 17, Pigment Black 26, Pigment Black 27, Pigment Black 28, Pigment Brown 29, Pigment Brown 35, Pigment Black 30, Pigment Black 32, Pigment Black 33 or mixtures thereof.

In some embodiments, the pigment is lithopone, zinc sulfide, barium sulfate, cobalt oxide, yellow iron oxide, orange iron oxide, red iron oxide, brown iron oxide, hematite, black iron oxide, micaceous iron oxide, chromium (III) green, ultramarine blue, ultramarine violet, ultramarine pink, cyanide iron blue, cadmium pigments or lead chromate pigments.

In some embodiments, the pigment is complex inorganic color pigments (CICP) such as spinel pigments, rutile pigments, zircon pigments or bismuth vanadate yellow. In some embodiments, useful spinel pigments include but are not limited to: $Zn(Fe,Cr)_2O_4$ brown, $CoAl_2O_4$ blue, $Co(AlCr)_2O_4$ blue-green, $Co_2TiO_4$ green, $CuCr_2O_4$ black or $(Ni,Mn,Co)(Cr,Fe)_2O_4$ black. In some embodiments, useful rutile pigments include but are not limited to: Ti—Ni—Sb yellow, Ti—Mn—Sb brown, Ti—Cr—Sb buff, zircon pigments or bismuth vanadate yellow.

In another embodiment, the pigment is an organic pigment. In some embodiments, useful organic pigments include but are not limited to: Aniline black (Pigment Black 1), Anthraquinone black, Monoazo type, Diazo type, Benzimidazolones, Diarylide yellow, Monoazo yellow salts, Dinitaniline orange, Pyrazolone orange, Azo red, Naphthol red, Azo condensation pigments, Lake pigments, Copper Phthalocyanine blue, Copper Phthalocyanine green, Quinacridones, Diaryl Pyrrolopyrroles, Aminoanthraquinone pigments, Dioxazines, Isoindolinones, Isoindolines, Quinophthalones, phthalocyanine pigments, idanthrone pigments, pigment violet 1, pigment violet 3, pigment violet 19 or pigment violet 23. In yet another embodiment, the organic pigment is a Vat dye pigment, such as but not limited to: perylene, perylene black, perinones or thioindigo. A uniform dispersion of isolated, individual pigment particles (aggregates) tends to produce uniform color intensity. In some embodiments, the pigment is milled. In some embodiments, the mean particle size of the pigment is between (and optionally including) any two of the following sizes: 0.2, 0.3, 0.4, 0.5, 0.6, 0.7, 0.8, 0.9 and 1.0 μm. In some embodiments, luminescent (fluorescent or phosphorescent), or pearlescent pigments can be used, alone, or in combination with other pigments or dyes.

In one embodiment, the colorant may include low conductivity carbon black. In some embodiments, the colorant contains between and including any two of the following: 1, 5, 10, 15 and 20 wt % low conductivity carbon black. In yet another embodiment, the colorant includes 2 to 9 wt % low conductivity carbon black.

Low conductivity carbon black is intended to mean, channel type black, furnace black or lamp black. In some embodiments, the low conductivity carbon black is a surface oxidized carbon black. One method for assessing the extent of surface oxidation (of the carbon black) is to measure the carbon black's volatile content. The volatile content can be measured by calculating weight loss when calcined at 950° C. for 7 minutes. Generally speaking, a highly surface oxidized carbon black (high volatile content) can be readily dispersed into a polymer precursor solution, which in turn can be imidized into a (well dispersed) filled polymer of the present disclosure. It is thought that if the carbon black particles (aggregates) are not in contact with each other, then electron tunneling, electron hopping or other electron flow mechanism are generally suppressed, resulting in lower electrical conductivity. In some embodiments, the low conductivity carbon black has a volatile content greater than or equal to 1%. In some embodiments, the low conductivity carbon black has a volatile content greater than or equal to 5, 9, or 13%. In some embodiments, furnace black may be surface treated to increase the volatile content. Typically, a low conductivity carbon black has a pH less than 6.

A uniform dispersion of isolated, carbon black particles (aggregates) not only decreases the electrical conductivity, but additionally tends to produce uniform color intensity. In some embodiments, the low conductivity carbon black is milled. In some embodiments, the mean particle size of the low conductivity carbon black is between (and optionally including) any two of the following sizes: 0.2, 0.3, 0.4, 0.5, 0.6, 0.7, 0.8, 0.9 and 1.0 μm.

Matting Agents

In one embodiment, the polyimide film contains 0.5 to 20 wt % of a matting agent selected from the group consisting of silica, alumina, zirconia, boron nitride, barium sulfate, polyimide particles, calcium phosphate, talc or mixtures thereof. In some embodiments, the polyimide film contains between and including any two of the following: 0.5, 1, 5, 10, 15 and 20 wt % matting agent. In one embodiment, a matting agent has a particle size in a range of from 2 to 10 μm, or from 3 to 9 μm, or from 5 to 7 μm.

Submicron Particles

In one embodiment, the polyimide film contains up to 39 wt % of at least one submicron particle, such as a submicron fumed metal oxide (also known as pyrogenic metal oxide) or a submicron colloidal metal oxide or a mixture thereof. In some embodiments, the submicron fumed metal oxide is fumed alumina, fumed silica or mixtures thereof. In one embodiment, the polyimide film includes up to 20 wt %, or up to 10 wt % of at least one submicron particle. In one embodiment, a submicron particle has a particle size of less than about 1 µm. In one embodiment, a submicron particle has a particle size in a range of from 0.01 to 1 µm, or from 0.05 to 0.5 µm.

The particle sizes of the submicron particles, carbon blacks and matting agents can be measured in the slurries by laser diffraction using a particle size analyzer, such as a LA-930 (Horiba, Instruments, Inc., Irvine Calif.), Mastersizer 3000 (Malvern Instruments, Inc., Westborough, Mass.) or LS-230 (Beckman Coulter, Inc., Indianapolis, Ind.). However, due to the tendency of the submicron particles to flocculate, it is sometimes more accurate to measure particle size of these milled slurries by observing in an optical microscope.

Polyimide Films

In one embodiment, a polyimide film can be produced by combining a diamine and a dianhydride (monomer or other polyimide precursor form) together with a solvent to form a polyamic acid solution. The dianhydride and diamine can be combined in a molar ratio of from 0.85:1 to 0.99:1, or from 0.90:1 to 0.99:1, or from 0.95:1 to 0.985:1, or from 0.965:1 to 0.985:1. The molecular weight of the polyamic acid formed therefrom can be adjusted by adjusting the molar ratio of the dianhydride and diamine, the solution viscosity, and the solids content. Instead of targeting dianhydride to diamine ratios of 1:1 or greater than 1:1, having a small deficit in the amount of dianhydride in the polyimide (less than a 1:1 ratio) can lead to polyimide chains containing amine chain end and increase the film stability under higher humidity and more acid environments. At these molar ratios, polyamic acid solutions with high viscosity and high solids content can be readily processed to form robust, flexible films with high $T_g$, low CTE and high tensile modulus. In one embodiment, polyamic acid solutions having PMDA and DAPBI monomers can be prepared with viscosities in a range of from 300 to 3000 poise, while having solids contents in a range of from 10 to 25%, enabling large scale roll-to-roll processing to form polyimide films. In one embodiment, the polyamic acid solution can have a viscosity in a range of from 500 to 2600, or from 1000 to 2400, or from 1300 to 2200 poise. In one embodiment, the polyamic acid solution can have a solids content in a range of from 13 to 25%, or from 16 to 22%.

Useful methods for producing polyamic acid solutions in accordance with the present invention can be found in U.S. Pat. No. 5,298,331, which is incorporate by reference into this specification for all teachings therein. Numerous variations are also possible, such as, (a) A method wherein diamines are exclusively dissolved in a solvent and then dianhydrides are added thereto at such a ratio as allowing to control the reaction rate.

(b) A method wherein the dianhydride components are exclusively dissolved in a solvent and then diamine components are added thereto at such a ratio to allow control of the reaction rate.

(c) A method wherein the polyamic acid with excessive diamine component and another polyamic acid with excessive dianhydride component are preliminarily formed and then reacted with each other in a reactor, particularly in such a way as to create a non-random or block copolymer.

(d) A method wherein a specific portion of the diamine components and the dianhydride components are first reacted and then the residual diamine components are reacted, or vice versa.

(e) A method wherein the components are added in part or in whole in any order to either part or whole of the solvent, also where part or all of any component can be added as a solution in part or all of the solvent.

(f) A method of first reacting one of the dianhydride components with one of the diamine components giving a first polyamic acid. Then reacting another dianhydride component with another diamine component to give a second polyamic acid. Then combining the amic acids in any one of a number of ways prior to imidization.

In one embodiment, a polyamic acid solution can be combined with conversion chemicals like: (i) one or more dehydrating agents, such as, aliphatic acid anhydrides and/or aromatic acid anhydrides (acetic anhydride, propionic anhydride, n-butyric anhydride, benzoic anhydride, trifluoroacetic anhydride and others); and (ii) one or more catalysts, such as, aliphatic tertiary amines (triethyl amine, etc.), aromatic tertiary amines (dimethyl aniline, etc.) and heterocyclic tertiary amines (pyridine, alpha, beta and gamma picoline (2-methylpyridine, 3-methylpyridine, 4-methylpyridine), isoquinoline, etc.).

In one embodiment, a conversion chemical can be an imidization catalyst (sometimes called an "imidization accelerator") that can help lower the imidization temperature and shorten the imidization time. Typical imidization catalysts can range from bases such as imidazole, 1-methylimidazole, 2-methylimidazole, 1,2-dimethylimidazole, 2-phenylimidazole, benzimidazole, isoquinoline, substituted pyridines such as methyl pyridines, lutidine, and trialkylamines and hydroxy acids such as isomers of hydroxybenzoic acid. The ratio of these catalysts and their concentration in the polyamic acid layer will influence imidization kinetics and the film properties.

In one embodiment, the polyamic acid solution can be heated, optionally in the presence of the imidization catalyst, to partially or fully imidize the polyamic acid, converting it to a polyimide. Temperature, time, and the concentration and choice of imidization catalyst can impact the degree of imidization of the polyamic acid solution. Preferably, the solution should be substantially imidized. In one embodiment, for a substantially polyimide solution, greater than 85%, greater than 90%, or greater than 95% of the amic acid groups are converted to the polyimide, as determined by infrared spectroscopy.

In one embodiment, the solvated mixture (the substantially imidized solution) can be cast to form a polyimide film. In another embodiment, the solvated mixture (the first substantially imidized solution) can be precipitated with an antisolvent, such as water or alcohols (e.g., methanol, ethanol, isopropyl alcohol), and the solid polyimide resin can be isolated. For instance, isolation can be achieved through filtration, decantation, centrifugation and decantation of the supernatant liquid, distillation or solvent removal in the vapor phase, or by other known methods for isolating a solid precipitate from a slurry. In one embodiment, the precipitate can be washed to remove the catalyst. After washing, the precipitate may be substantially dried, but need not be completely dry. The polyimide precipitate can be re-dissolved in a second solvent, such as methyl isobutyl ketone (MIBK), methyl ethyl ketone (MEK), ethyl acetate, methyl acetate, ethyl formate, methyl formate, tetrahydrofuran, acetone, DMAc, NMP and mixtures thereof, to form a second substantially imidized solution (a casting solution), which can be cast to form a polyimide film.

The casting solution can further comprise any one of a number of additives, such as processing aids (e.g., oligomers), antioxidants, light stabilizers, flame retardant additives, anti-static agents, heat stabilizers, ultraviolet absorbing agents, inorganic fillers or various reinforcing agents. Inorganic fillers can include thermally conductive fillers, metal oxides, inorganic nitrides and metal carbides. Common inorganic fillers are alumina, silica, diamond, clay, boron nitride, aluminum nitride, titanium dioxide, dicalcium phosphate, and fumed metal oxides. Low color organic fillers, such as polydialkylfluorenes, can also be used.

In one embodiment, the elastic modulus of a polyimide film can be increased by the presence of sub-micron fillers. The sub-micron filler can be inorganic or organic and can be present in an amount between and optionally including any two of the following percentages: 5, 10, 15, 20, 25, 30, 35, 40, 45, 50, 55 and 60 weight percent of the polyimide film.

In one embodiment the sub-micron filler can have a size of less than 550 nm in at least one dimension. In other embodiments, the filler can have a size of less than 500, less than 450, less than 400, less than 350, less than 300, less than 250, less than 200 nm, or less than 100 nm in at least one dimension (since fillers can have a variety of shapes in any dimension and since filler shape can vary along any dimension, the "at least one dimension" is intended to be a numerical average along that dimension). The average aspect ratio of the filler can be 1, for spherical particles, or greater than 1 for non-spherical particles. In some embodiments, the sub-micron filler is selected from a group consisting of needle-like fillers (acicular), fibrous fillers, platelet fillers, polymer fibers, and mixtures thereof. In one embodiment, the sub-micron filler is substantially non-aggregated. The sub-micron filler can be hollow, porous, or solid, or can have a core-shell structure where one composition is in the core and a second composition is in the shell. In one embodiment, the sub-micron fillers of the present disclosure exhibit an aspect ratio of at least 1:1, at least 2:1, at least 4:1, at least 6:1, at least 8:1, at least 10:1, at least 12:1, or at least 15:1.

In some embodiments, sub-micron fillers are 100 nm in size or less in at least one dimension. In some embodiments, the fillers are spherical, lenticular or oblong in shape and are nanoparticles. In one embodiment, sub-micron fillers can include inorganic oxides, such as oxides of silicon, aluminum and titanium, hollow (porous) silicon oxide, antimony oxide, zirconium oxide, indium tin oxide, antimony tin oxide, mixed titanium/tin/zirconium oxides, and binary, ternary, quaternary and higher order composite oxides of one or more cations selected from silicon, titanium, aluminum, antimony, zirconium, indium, tin, zinc, niobium and tantalum. In one embodiment, nanoparticle composites (e.g. single or multiple core/shell structures) can be used, in which one oxide encapsulates another oxide in one particle.

In one embodiment, sub-micron fillers can include other ceramic compounds, such as boron nitride, aluminum nitride, ternary or higher order compounds containing boron, aluminum and nitrogen, gallium nitride, silicon nitride, aluminum nitride, zinc selenide, zinc sulfide, zinc telluride, and their combinations, or higher order compounds containing multiple cations and multiple anions.

In one embodiment, solid silicon oxide nanoparticles can be produced from sols of silicon oxides (e.g., colloidal dispersions of solid silicon oxide nanoparticles in liquid media), especially sols of amorphous, semi-crystalline, and/ or crystalline silica. Such sols can be prepared by a variety of techniques and in a variety of forms, which include hydrosols (i.e., where water serves as the liquid medium), organosols (i.e., where organic liquids serves as the liquid medium), and mixed sols (i.e., where the liquid medium comprises both water and an organic liquid). See, e.g., descriptions of the techniques and forms disclosed in U.S. Pat. Nos. 2,801,185, 4,522,958 and 5,648,407. In one embodiment, the nanoparticle is suspended in a polar, aprotic solvent, such as, DMAc or other solvent compatible with polyamic acid or polyimide solution. In another embodiment, solid silicon oxide nanoparticles can be commercially obtained as colloidal dispersions or sols dispersed in polar aprotic solvents, such as for example DMAC-ST (Nissan Chemical America Corporation, Houston, Tex.), a solid silica colloid in dimethylacetamide containing less than 1 percent water by weight, with 20-21 wt % $SiO_2$, with a median nanosilica particle diameter $d_{50}$ of about 20 nm.

In one embodiment, sub-micron fillers can be porous and can have pores of any shape. One example is where the pore comprises a void of lower density and low refractive index (e.g., a void containing air) formed within a shell of an oxide such as silicon oxide, i.e., a hollow silicon oxide nanoparticle. The thickness of the sub-micron fillers shell affects the strength of the sub-micron fillers. As the hollow silicon oxide particle is rendered to have reduced refractive index and increased porosity, the thickness of the shell decreases resulting in a decrease in the strength (i.e., fracture resistance) of the sub-micron fillers. Methods for producing such hollow silicon oxide nanoparticles are known, for example, as described in Japanese Patent Nos. 4406921B2 and 4031624B2. Hollow silicon oxide nanoparticles can be obtained from JGC Catalysts and Chemicals, LTD, Japan.

In one embodiment, sub-micron fillers can be coated with a coupling agent. For example, a nanoparticle can be coated with an aminosilane, phenylsilane, acrylic or methacrylic coupling agents derived from the corresponding alkoxysilanes. Trimethylsilyl surface capping agents can be introduced to the nanoparticle surface by reaction of the sub-micron fillers with hexamethyldisilazane. In one embodiment, sub-micron fillers can be coated with a dispersant. In one embodiment, sub-micron fillers can be coated with a combination of a coupling agent and a dispersant. Alternatively, the coupling agent, dispersant or a combination thereof can be incorporated directly into the polyimide film and not necessarily coated onto the sub-micron fillers.

In some embodiments, the sub-micron filler is chosen so that it does not itself degrade or produce off-gasses at the desired processing temperatures. Likewise, in some embodiments, the sub-micron filler is chosen so that it does not contribute to degradation of the polymer.

In one embodiment, a polyamic acid solution can form a "green film" which is partially polyamic acid and partially polyimide, and may be formed in a thermal conversion process. Green film generally contains about 50 to 75 wt % polymer and 25 to 50 wt % solvent. Generally, it should be sufficiently strong to be substantially self-supporting. Green film can be prepared by casting the polyamic acid solution into film form onto a suitable support such as a casting drum or belt and removing the solvent by mild heating at up to 150° C. A low proportion of amic acid units in the polymer, e.g., up to 25%, may be converted to imide units. In one embodiment, the polyamic acid solution can be cast or applied onto a support, such as an endless belt or rotating drum, to form a green film. Alternatively, it can be cast on a polymeric carrier such as PET, other forms of Kapton® polyimide film (e.g., Kapton® HN or Kapton® OL films) or other polymeric carriers. Next, the solvent containing-film can be converted into a polyimide film by heating to partially or fully remove the solvent. In some aspects of the invention, the green film is separated from the carrier before drying to completion. Final drying steps can be performed with dimensional support or stabilization of the film. In other aspects, the wet film is heated directly on the carrier.

In one embodiment, a substantially imidized polyimide solution can be cast or applied onto a support, such as an endless belt or rotating drum, to form a film. Alternatively, it can be cast on a polymeric carrier such as PET, other forms of Kapton® polyimide film (e.g., Kapton® HN or Kapton® OL films) or other polymeric carriers. Next, the solvent containing-film can be converted into a film by heating to partially or fully remove the solvent. In some aspects of the invention, the film is separated from the carrier before drying to completion. Final drying steps can be performed with dimensional support or stabilization of the film. In other aspects, the film is heated directly on the carrier.

The thickness of the polyimide film may be adjusted, depending on the intended purpose of the film or final application specifications. In one embodiment, the polyimide film has a total thickness in a range of from 4 to 150 μm, or from 5 to 100 μm, or from 10 to 80 μm.

When polyimide film is used as a flexible TFT substrate for an electronic device, such as a flexible OLED display, E-Paper or sensor, the tensile modulus of the substrate film must have a high modulus (>6.0 GPa) because the polyimide film, supported by a glass substrate will go through the TFT formation process and subsequently need to peel off of the glass substrate (debonding) smoothly without film deformation. Typically, film-glass laminates will undergo high temperature TFT (thin film transistor) processing for extended periods of time at 450° C., so the $T_g$ of the polyimide film must at least be above 400° C. to maintain good mechanical properties of the film throughout the TFT manufacturing process. The CTE match between the polyimide film and glass substrate must also be good to limit thermal stresses at the polymer/glass interface and avoid delamination, curling and film-cracking during TFT processing. In one embodiment, the polyimide film has a tensile modulus of 6.0 GPa or more, or 7.0 GPa or more, or 8.0 GPa or more. In one embodiment, the polyimide film has a $T_g$ of 400° C. or higher, or 425° C. or higher, or 450° C. or higher. In one embodiment, the polyimide film has a coefficient of thermal expansion of 15 ppm/° C. or less, or 10 ppm/° C. or less, or 5 ppm/° C. or less, over a temperature range of 50 to 500° C.

Metal-Clad Laminates

In one embodiment, a conductive layer of the present invention can be created by:
  i. metal sputtering (optionally, then electroplating);
  ii. foil lamination; and/or
  iii. any conventional or non-conventional method for applying a thin metallic layer to a substrate.

Metal-clad laminates can be formed as single-sided laminates or double-sided laminates by any number of well-known processes. In one embodiment, a lamination process may be used to form a metal-clad laminate with a polymer film or multilayer polyimide film. In one embodiment, a first outer layer including a first thermoplastic polyimide is placed between a first conductive layer and a core layer, and a second outer layer including a second thermoplastic polyimide is placed on the opposite side of the core layer. In one embodiment, a second conductive layer is placed in contact with the second outer layer on a side opposite the core layer. One advantage of this type of construction is that the lamination temperature of the multilayer film is lowered to the lamination temperature necessary for the thermoplastic polyimide of the outer layer to bond to a conductive layer(s). In one embodiment, the conductive layer(s) is a metal layer(s).

For example, prior to the step of applying a polymer film onto a metal foil, the polymer film can be subjected to a pre-treatment step. Pre-treatment steps can include, heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543,222, incorporated herein by reference.

In addition, (for purposes of improving adhesion) the conductive metal surface may be treated with various organic and inorganic treatments. These treatments include using silanes, imidazoles, triazoles, oxide and reduced oxide treatments, tin oxide treatment, and surface cleaning/roughening (called micro-etching) via acid or alkaline reagents.

In a further embodiment, the polyamic acid precursor (to a polyimide film of the present invention) may be coated on a fully cured polyimide base film or directly on a metal substrate and subsequently imidized by heat treatment. The polyimide base film may be prepared by either a chemical or thermal conversion process and may be surface treated, e.g. by chemical etching, corona treatment, laser etching etc., to improve adhesion.

As used herein, the term "conductive layers" and "conductive foils" mean metal layers or metal foils (thin compositions having at least 50% of the electrical conductivity of a high-grade copper). Conductive foils are typically metal foils. Metal foils do not have to be used as elements in pure form; they may also be used as metal foil alloys, such as copper alloys containing nickel, chromium, iron, and other metals. The conductive layers may also be alloys of metals and are typically applied to the polyimides of the present invention via a sputtering step followed by an electro-plating step. In these types of processes, a metal seed coat layer is first sputtered onto a polyimide film. Finally, a thicker coating of metal is applied to the seed coat via electro-plating or electro-deposition. Such sputtered metal layers may also be hot pressed above the glass transition temperature of the polymer for enhanced peel strength.

Particularly suitable metallic substrates are foils of rolled, annealed copper or rolled, annealed copper alloy. In many cases, it has proved to be advantageous to pre-treat the metallic substrate before coating. This pre-treatment may include, but is not limited to, electro-deposition or immersion-deposition on the metal of a thin layer of copper, zinc, chrome, tin, nickel, cobalt, other metals, and alloys of these metals. The pre-treatment may consist of a chemical treatment or a mechanical roughening treatment. It has been found that this pre-treatment enables the adhesion of the polyimide layer and, hence, the peel strength to be further increased. Apart from roughening the surface, the chemical pre-treatment may also lead to the formation of metal oxide groups, enabling the adhesion of the metal to a polyimide layer to be further increased. This pre-treatment may be applied to both sides of the metal, enabling enhanced adhesion to substrates on both sides.

In one embodiment, a metal-clad laminate can include the polymer film that is a single-layer film or a multilayer film and a first metal layer adhered to an outer surface of the first outer layer of the multilayer film. In one embodiment, a metal-clad laminate can include a second metal layer adhered to an outer surface of the second outer layer of the multilayer film. In one embodiment, the first metal layer, the second metal layer or both metal layers can be copper. In one embodiment, a metal-clad laminate of the present invention comprising a double-side copper-clad can be prepared by laminating copper foil to both sides of the single-layer or multilayer film.

Applications

In one embodiment, a polyimide film with high $T_g$, high tensile strength and low CTE can be used in electronic device applications, such as flexible device layers for electronic device or a coverlay for a printed circuit board or other electronic components in an electronic device, providing protection from physical damage, oxidation and other contaminants that may adversely affect the function of the electronic components.

In one embodiment, a polyimide film that is a flexible device layer can be used for any number of layers in electronic device applications, such as in an organic electronic device, where a combination of good high temperature resistance stability and excellent mechanical properties is desirable. Nonlimiting examples of such layers include thin-film transistor (TFT) substrates for flexible displays, such as organic light-emitting diode (OLED) displays, electronic paper (E-paper) and touch sensor panels (TSPs), substrates for color filter sheets, cover films, and other device layers. The particular materials' properties requirements for each application are unique and may be addressed by appropriate composition(s) and processing condition(s) for the polyimide films disclosed herein. Organic electronic devices that may benefit from having a polyimide film include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode).

In one embodiment, a metal-clad laminate having a polyimide film is particularly useful for die pad bonding of flexible print connection boards or semiconductor devices or packaging materials for CSP (chip scale package), chip on film (COF), COL (chip on lead), LOC (lead on chip), multi-chip module ("MCM"), ball grid array ("BGA" or micro-ball grid array), and/or tape automated bonding ("TAB").

In another embodiment, the polyimide films are useful for wafer level integrated circuit packaging, where a composite is made using a polyimide film interposed between a conductive layer (typically a metal) having a thickness of less than 100 μm, and a wafer comprising a plurality of integrated circuit dies. In one (wafer level integrated circuit packaging) embodiment, the conductive passageway is connected to the dies by a conductive passageway, such as a wire bond, a conductive metal, a solder bump or the like.

The advantageous properties of this invention can be observed by reference to the following examples that illustrate, but do not limit, the invention. All parts and percentages are by weight unless otherwise indicated.

EXAMPLES

Test Methods

Glass Transition Temperature and Storage Modulus

Glass transition temperature ($T_g$) and storage modulus at 50° C. and 400° C. were measured using dynamic mechanical analysis (Q800 DMA, TA Instruments, New Castle, Del.). These DMA profiles of the films were collected over the temperature range of 25° C. to 520° C. at a heating rate of 5° C./min.

Coefficient of Thermal Expansion

Coefficient of thermal expansion (CTE) in both the machine direction (MD) and transverse direction (TD) of the films were measure by thermomechanical analysis (Q400 TMA, TA Instruments).

Tensile Modulus, Tensile Strength, and Elongation to Break

Tensile properties (modulus, strength and elongation to break) of films were measured at room temperature following the ASTM D882 test method using 0.5×4" film samples and a cross-head speed of 2 in/min.

Thickness

Coating thickness was determined by measuring coated and uncoated samples in 10 positions across the TD direction of the film using a contact-type FISCHERSCOPE MMS PC2 modular measurement system thickness gauge (Fisher Technology Inc., Windsor, Conn.).

Peel Strength

Peel strengths were measured using 0.5×3" film samples. The crosshead peeling speed was 2 in/min using a 90° German wheel configuration following IPC test method 2.4.9D for die-cut specimens. CTE, dielectric constant ($D_k$) and dissipation factor ($D_f$) values of the polyimide films in copper-clads are collected after etching off the entire Cu foil of each sample.

Comparative Example 1

For Comparative Example 1 (CE1), to prepare a polyamic acid (PAA) with a monomer composition of PMDA 1.0// PPD 0.7/ODA 0.3, 6.497 g of p-phenylenediamine (PPD) and 5.156 g of 4,4'-diaminodiphenyl ether (ODA) were mixed into 120 g of dimethylacetamide (DMAc) at 25° C., stirring at 150 rpm. 18.347 g of pyromellitic dianhydride (PMDA) was then added and the mixture was allowed to stir for 3 hours. The prepolymer solution was adjusted ("finished") to ~2000 poise using small additions of 6 wt % PMDA solution in DMAc while stirring at 50 rpm.

To prepare a film, the PAA solution was mixed for 2 minutes in a centrifugal-planetary mixer (THINKY USA, Laguna Hills, Calif.) to obtain a solution. The solution was de-gassed using the centrifugal-planetary mixer to force the gas from the polymer at 2000 rpm for 20 minutes and then cast onto a glass plate at 25° C. using a metal bar to produce ~1.5 mil dried films. The film on the glass substrate was heated to 120° C. for 80 minutes on a hot plate, resulting in a green film with 65-70% solids, and subsequently lifted off the glass surface and mounted onto a 10×10 inch pin frame. The mounted film was placed in a furnace and heated from 120 to 340° C. (10° C./min), transferred to a 400° C. furnace and held for 8 minutes. The films were removed "hot" from the oven and allowed to cool in air.

Comparative Example 2

For Comparative Example 2 (CE2), to prepare a PAA with a monomer composition of PMDA 1.0//MPD 0.35/PPD 0.35/ODA 0.3, 3.249 g of PPD, 3.249 g of m-phenylenediamine (MPD) and 5.156 g of ODA were mixed into 120 g of DMAc, followed by the addition of 18.347 g of PMDA, and then finishing to ~2000 poise, all following the procedure of CE1. Films were also prepared following the procedure of CE1.

Comparative Example 3

For Comparative Example 3 (CE3), to prepare a PAA with a monomer composition of PMDA 1.0//MPD 0.7/ODA 0.3, 6.497 g of MPD and 5.156 g of ODA were mixed into 120 g of DMAc, followed by the addition of 18.347 g of PMDA, and then finishing to ~2000 poise, all following the procedure of CE1. Films were also prepared following the procedure of CE1.

Comparative Example 4

For Comparative Example 4 (CE4), to prepare a PAA with a monomer composition of PMDA 1.0//DAPBI 0.35/PPD 0.35/ODA 0.3, 6.035 g of 5-amino-2-(4-aminophenyl)benzimidazole (DAPBI), 2.910 g of PPD and 4.619 g of ODA were mixed into 120 g of DMAc, followed by the addition of 16.436 g of PMDA, and then finishing to ~2000 poise, all following the procedure of CE1. Films were also prepared following the procedure of CE1.

Comparative Example 5

For Comparative Example 5 (CE5), to prepare a PAA with a monomer composition of PMDA 1.0//DAPBI 0.35/MPD 0.35/ODA 0.3, 6.035 g of DAPBI, 2.910 g of MPD and 4.619 g of ODA were mixed into 120 g of DMAc, followed by the addition of 16.436 g of PMDA, and then finishing to ~2000 poise, all following the procedure of CE1. Films were also prepared following the procedure of CE1.

Comparative Example 6

For Comparative Example 6 (CE6), to prepare a PAA with a monomer composition of PMDA 0.7/BPDA 0.3//PPD 0.7/ODA 0.3, 6.099 g of PPD and 4.840 g of ODA were mixed into 120 g of DMAc, followed by the addition of 11.950 g of PMDA and 7.111 g of 3,3',4,4'-biphenyltetracarboxylic dianhydride (s-BPDA), and then finishing to ~2000 poise, all following the procedure of CE1. Films were also prepared following the procedure of CE1.

Comparative Example 7

For Comparative Example 7 (CE7), to prepare a PAA with a monomer composition of PMDA 0.3/BPDA 0.7//PPD 0.7/ODA 0.3, 5.638 g of PPD and 4.474 g of ODA were mixed into 120 g of DMAc, followed by the addition of 4.549 g of PMDA and 15.339 g of s-BPDA, and then finishing to ~2000 poise, all following the procedure of CE1. Films were also prepared following the procedure of CE1.

Comparative Example 8

For Comparative Example 8 (CE8), to prepare a PAA with a monomer composition of PMDA 0.7/BPDA 0.3//PPD 0.7/DAPBI 0.3, 5.983 g of PPD and 5.318 g of DAPBI were mixed into 120 g of DMAc, followed by the addition of 11.723 g of PMDA and 6.976 g of s-BPDA, and then finishing to ~2000 poise, all following the procedure of CE1. Films were also prepared following the procedure of CE1.

Comparative Example 9

For Comparative Example 9 (CE9), to prepare a PAA with a monomer composition of PMDA 0.3/BPDA 0.7//PPD 0.7/DAPBI 0.3, 5.539 g of PPD and 4.923 g of DAPBI were mixed into 120 g of DMAc, followed by the addition of 4.469 g of PMDA and 15.070 g of s-BPDA, and then finishing to ~2000 poise, all following the procedure of CE1. Films were also prepared following the procedure of CE1.

Comparative Example 10

For Comparative Example 10 (CE10), to prepare a PAA with a monomer composition of BPDA 1.0//DAPBI 1.0, 13.086 g of DAPBI was mixed into 120 g of DMAc, followed by the addition of 17.168 g of s-BPDA, and then finishing to ~2000 poise, all following the procedure of CE1. Films were also prepared following the procedure of CE1.

Comparative Example 11

For Comparative Example 11 (CE11), to prepare a PAA with a monomer composition of PMDA 1.0//PPD 0.3/ODA 0.7, 2.519 g of PPD and 10.884 g of ODA were mixed into 120 g of DMAc, followed by the addition of 16.597 g of PMDA, and then finishing to ~2000 poise, all following the procedure of CE1. Films were also prepared following the procedure of CE1.

Example 1

For Example 1 (E1), to prepare a PAA with a monomer composition of PMDA 1.0//DAPBI 1.0, 12.411 g of DAPBI was mixed into 126 g of DMAc at 25° C., stirring at 150 rpm forming an opaque solution. 11.589 g of PMDA was then added and the mixture became transparent and was allowed to stir for 3 hours. The prepolymer solution was adjusted ("finished") to 2048 poise using small additions of 6 wt % PMDA solution in DMAc while stirring at 50 rpm, reaching a final stoichiometry of 0.97:1 dianhydride to diamine. Films were prepared following the procedure of CE1.

Example 2

For Example 2 (E2), to prepare a PAA with a monomer composition of PMDA 0.9/BPDA 0.1//DAPBI 1.0, 12.197 g of DAPBI was mixed into 126 g of DMAc, followed by the addition of 10.202 g of PMDA and 1.600 g of s-BPDA, and then finishing to 2377 poise, all following the procedure of E1. The final stoichiometry was 0.981:1 dianhydride to diamine. Films were prepared following the procedure of CE1.

Example 3

For Example 3 (E3), to prepare a PAA with a monomer composition of PMDA 0.85/BPDA 0.15//DAPBI 1.0, 15.987 g of DAPBI was mixed into 168 g of DMAc, followed by the addition of 11.818 g of PMDA and 4.195 g of s-BPDA, and then finishing to 2208 poise, all following the procedure of E1. Films were prepared following the procedure of CE1.

Example 4

For Example 4 (E4), to prepare a PAA with a monomer composition of PMDA 0.8/BPDA 0.2//DAPBI 1.0, 12.093 g of DAPBI was mixed into 126 g of DMAc, followed by the addition of 9.527 g of PMDA and 2.380 g of s-BPDA, and then finishing to 2250 poise, all following the procedure of E1. Films were prepared following the procedure of CE1, except that they were held at 400° C. for 7 minutes instead of 8 minutes.

Example 5

For Example 5 (E5), to prepare a PAA with a monomer composition of PMDA 0.7/BPDA 0.3//DAPBI 1.0, 15.721 g of DAPBI was mixed into 168 g of DMAc, followed by the addition of 10.092 g of PMDA and 6.188 g of s-BPDA, and then finishing to 2180 poise, all following the procedure of E1. Films were prepared following the procedure of CE1.

Example 6

For Example 6 (E6), to prepare a PAA with a monomer composition of PMDA 1.0//DAPBI 0.9/PPD 0.1, 11.478 g of DAPBI and 0.615 g of PPD were mixed into 126 g of DMAc, followed by the addition of 11.907 g of PMDA, and then finishing to 1934 poise, all following the procedure of E1. Films were prepared following the procedure of CE1.

Example 7

For Example 7 (E7), to prepare a PAA with a monomer composition of PMDA 0.9/BPDA 0.1//DAPBI 0.9/PPD 0.1, 11.274 g of DAPBI and 0.604 g of PPD were mixed into 126 g of DMAc, followed by the addition of 10.478 g of PMDA and 1.643 g of s-BPDA, and then finishing to 1820 poise, all following the procedure of E1. Films were prepared following the procedure of CE1.

Example 8

For Example 8 (E8), to prepare a PAA with a monomer composition of PMDA 1.0//DAPBI 0.8/PPD 0.2, 10.491 g of DAPBI and 1.265 g of PPD were mixed into 126 g of DMAc, followed by the addition of 12.244 g of PMDA, and then finishing to 2231 poise, all following the procedure of E1. Films were prepared following the procedure of CE1.

Example 9

For Example 9 (E9), to prepare a PAA with a monomer composition of PMDA 0.9/BPDA 0.1//DAPBI 0.8/PPD 0.2, 10.300 g of DAPBI and 1.242 g of PPD were mixed into 126 g of DMAc, followed by the addition of 10.769 g of PMDA and 1.689 g of s-BPDA, and then finishing to 2341 poise, all following the procedure of E1. Films were prepared following the procedure of CE1.

Example 10

For Example 10 (E10), to prepare a PAA with a monomer composition of PMDA 1.0//DAPBI 0.9/MPD 0.1, 11.478 g of DAPBI and 0.615 g of MPD were mixed into 126 g of DMAc, followed by the addition of 11.907 g of PMDA, and then finishing to 2011 poise, all following the procedure of E1. Films were prepared following the procedure of CE1.

Example 11

For Example 11 (E11), to prepare a PAA with a monomer composition of PMDA 0.9/BPDA 0.1//DAPBI 0.9/MPD 0.1, 11.274 g of DAPBI and 0.604 g of MPD were mixed into 126 g of DMAc, followed by the addition of 10.478 g of PMDA and 1.643 g of s-BPDA, and then finishing to 2194 poise, all following the procedure of E1. Films were prepared following the procedure of CE1.

Example 12

For Example 12 (E12), to prepare a PAA with a monomer composition of PMDA 1.0//DAPBI 0.8/MPD 0.2, 10.491 g of DAPBI and 1.265 g of MPD were mixed into 126 g of DMAc, followed by the addition of 12.244 g of PMDA, and then finishing to 1280 poise, all following the procedure of E1. Films were prepared following the procedure of CE1.

Example 13

For Example 13 (E13), to prepare a PAA with a monomer composition of PMDA 0.9/BPDA 0.1//DAPBI 0.8/MPD 0.2, 10.300 g of DAPBI and 1.242 g of MPD were mixed into 126 g of DMAc, followed by the addition of 10.769 g of PMDA and 1.689 g of s-BPDA, and then finishing to 1331 poise, all following the procedure of E1. Films were prepared following the procedure of CE1.

Example 14

For Example 14 (E14), to prepare a PAA with a monomer composition of PMDA 0.7/BPDA 0.3//DAPBI 0.7/PPD 0.3, 8.935 g of DAPBI and 1.847 g of PPD were mixed into 126 g of DMAc, followed by the addition of 8.194 g of PMDA and 5.024 g of s-BPDA, and then finishing to ~2000 poise, all following the procedure of E1. Films were prepared following the procedure of CE1.

Example 15

For Example 15 (E15), to prepare a PAA with a monomer composition of PMDA 0.3/BPDA 0.7//DAPBI 0.7/PPD 0.3, 8.334 g of DAPBI and 1.722 g of PPD were mixed into 126 g of DMAc, followed by the addition of 3.011 g of PMDA and 10.933 g of s-BPDA, and then finishing to ~2000 poise, all following the procedure of E1. Films were prepared following the procedure of CE1.

Example 16

For Example 16 (E16), to prepare a PAA with a monomer composition of PMDA 0.3/BPDA 0.7//DAPBI 0.5/PPD 0.5, 6.275 g of DAPBI and 3.026 g of PPD were mixed into 126 g of DMAc, followed by the addition of 3.174 g of PMDA and 11.526 g of s-BPDA, and then finishing to 1200 poise, all following the procedure of E1. Films were prepared following the procedure of CE1.

Example 17

For Example 17 (E17), to prepare a PAA with a monomer composition of PMDA 1.0//DAPBI 1.0, 12.411 g of DAPBI was mixed into 126 g of DMAc at 30° C., stirring at 150 rpm forming an opaque solution. 11.589 g of PMDA was then added and the mixture became transparent and was allowed to stir for 3 hours. The prepolymer solution was adjusted ("finished") to 3000 poise using small additions of 6 wt % PMDA solution in DMAc while stirring at 50 rpm, reaching a final stoichiometry of 0.981:1 dianhydride to diamine.

To prepare a soluble polyimide solution, the solids content was reduced from 16 wt % to 9.5 wt % by adding 103 g DMAc and stirring the PAA solution for 1 hour. While keeping the solution at 40° C., 1.289 g of beta-picoline and 1.413 g of acetic anhydride were gradually added into the PAA solution, making sure the viscosity of the solution was stable. The solution was stirred at 100 rpm and 80° C. for 7 hours and then cooled to room temperature.

To prepare a film, the polyimide solution was cast onto a glass plate at 25° C. using a metal bar to produce~1.5 mil dried films. The film on the glass substrate was heated to 80°

C. for 20 minutes on a hot plate, and subsequently lifted off the glass surface and mounted onto a 10×10 inch pin frame. The mounted film was placed in a furnace and heated from 120 to 250° C. (10° C./min) and held at 250° C. for 20 minutes. The films were removed "hot" from the oven and allowed to cool in air.

Example 18

For Example 18 (E18), to prepare a PAA with a monomer composition of PMDA 0.9/BPDA 0.1//DAPBI 1.0, 12.197 g of DAPBI was mixed into 126 g of DMAc, followed by the addition of 10.202 g of PMDA and 1.600 g of s-BPDA, and then finishing to 3000 poise, all following the procedure of E17. The final stoichiometry was 0.985:1 dianhydride to diamine.

To prepare a soluble polyimide solution, the solids content was reduced from 16 wt % to 9.5 wt % by adding 103 g DMAc and stirring the PAA solution for 1 hour. While keeping the solution at 40° C., 1.266 g of beta-picoline and 1.388 g of acetic anhydride were gradually added into the PAA solution, making sure the viscosity of the solution was stable. The solution was stirred at 100 rpm and 80° C. for 7 hours and then cooled to room temperature. Films were prepared following the procedure of E17.

Table 1 summarizes the thermal and mechanical properties of CE1-CE11 and E1-E18. The CTE values of CE7, E15 and E16 were measured over 50-450° C. since their $T_g$'s are less than 450° C. The CTE values of E1 to E14 are close to zero when measured over 50-450° C.

Polyimide/Copper-Clad Laminates

Four polyimide/copper-clad laminates (CCLs) were prepared by casting different polyamic acid formulations (E1, E2, CE10 and E16) onto 12 μm Cu foil (BHM-102F-HA-V2, JX Nippon Mining & Metals, Corp., Japan) followed by thermal imidization to form the CCLs using the following procedure.

PAA solutions were de-gassed for 10 minutes and then cast onto the matte side (silane treated side) of the Cu foils at 25° C. using a metal bar to produce ~1 mil dried films (the Cu foils had been adhered to glass plates prior to casting the solutions). The wet PAA/Cu-clad on the glass substrate was heated to 120° C. for 80 minutes on a hot plate except heated to 120° C. for 30 minutes for E16, resulting in a green film (65-70% solids)/Cu-clad multilayer. The multilayer on glass was then placed in a nitrogen-purged furnace and heated from room temperature to 50° C. (1.25° C./min), followed by 50 to 400° C. (10° C./min) and held at 400° C. for 5 minutes. The films were cooled from 400° C. to 50° C. over 60 minutes in $N_2$ protection and then allowed to cool to room temperature in air. The CCLs were removed from the glass and tested for mechanical and electrical properties as shown in Table 2.

TABLE 1

| | Dianhydride | | Diamine | | | | $T_g$ (tanΔ) | DMA Modulus (MPa) 50° C. | DMA Modulus (GPa) 400° C. | CTE (50-500° C.) MD | CTE (50-500° C.) TD | CTE (50-500° C.) Avg | Modulus (GPa) |
|---|---|---|---|---|---|---|---|---|---|---|---|---|---|
| Example | PMDA | BPDA | ODA | DAPBI | PPD | MPD | | | | | | | |
| CE1 | 1 | | 0.3 | | 0.7 | | 471 | 3972 | 2.3 | 39.7 | 43.8 | 41.7 | 4.0 |
| CE2 | 1 | | 0.3 | | 0.35 | 0.35 | 472.7 | 1782 | 1.3 | 63.3 | 55.7 | 59.5 | 2.8 |
| CE3 | 1 | | 0.3 | | | 0.7 | 448.4 | 1188 | 1.2 | 65.0 | 63.1 | 64.0 | 2.5 |
| CE4 | 1 | | 0.3 | 0.35 | 0.35 | | 457.7 | 3472 | 1.8 | 29.3 | 26.9 | 28.1 | 4.2 |
| CE5 | 1 | | 0.3 | 0.35 | | 0.35 | 462.4 | 1937 | 1.3 | 29.6 | 27.3 | 28.5 | 3.5 |
| CE6 | 0.7 | 0.3 | 0.3 | | 0.7 | | 479.8 | 3015 | 1.7 | 64.9 | 57.6 | 61.3 | 3.3 |
| CE7 | 0.3 | 0.7 | 0.3 | | 0.7 | | 331.9 | 4143 | 0.3 | 47.6* | 33.2* | 40.4* | 3.9 |
| CE8 | 0.7 | 0.3 | | 0.3 | 0.7 | | 449.5 | 4776 | 1.7 | 11.2 | 5.81 | 8.5 | 5.6 |
| CE9 | 0.3 | 0.7 | | 0.3 | 0.7 | | 395.3 | 2121 | 0.2 | — | — | — | 5.2 |
| CE10 | | 1 | | 1 | | | 414.3 | 2700 | 0.6 | — | — | — | 7.8 |
| CE11 | 1 | | 0.7 | | 0.3 | | 409.6 | 2538 | 0.5 | 54.1 | 53.7 | 53.9 | 3.2 |
| E1 | 1 | | | 1 | | | 468.0 | 6582 | 4.0 | −3.80 | −4.35 | −4.1 | 9.6 |
| E2 | 0.9 | 0.1 | | 1 | | | 463.9 | 7792 | 2.9 | −1.31 | −4.51 | −2.9 | 8.6 |
| E3 | 0.85 | 0.15 | | 1 | | | 466.9 | 8076 | 3.3 | −16.0 | −9.01 | −12.5 | 10.3 |
| E4 | 0.8 | 0.2 | | 1 | | | 473.1 | 6949 | 2.8 | −11.5 | −7.76 | −9.6 | 8.1 |
| E5 | 0.7 | 0.3 | | 1 | | | 460.7 | 7525 | 3.0 | 6.22 | 8.11 | 7.17 | 7.6 |
| E6 | 1 | | | 0.9 | 0.1 | | 469.5 | 5014 | 2.4 | −3.21 | −1.50 | −2.4 | 8.3 |
| E7 | 0.9 | 0.1 | | 0.9 | 0.1 | | 460.2 | 7088 | 2.6 | −3.05 | −5.06 | −4.1 | 8.3 |
| E8 | 1 | | | 0.8 | 0.2 | | 467.9 | 5918 | 2.5 | −2.73 | 0.43 | −1.2 | 8.8 |
| E9 | 0.9 | 0.1 | | 0.8 | 0.2 | | 462.8 | 6210 | 2.8 | −3.9 | −13.0 | −8.5 | 9.0 |
| E10 | 1 | | | 0.9 | | 0.1 | 481.3 | 6863 | 3.0 | −7.20 | −5.73 | −6.5 | 7.4 |
| E11 | 0.9 | 0.1 | | 0.9 | | 0.1 | 480.5 | 7090 | 3.0 | −6.42 | −8.84 | −7.6 | 8.5 |
| E12 | 1 | | | 0.8 | | 0.2 | 482.7 | 5260 | 2.4 | −3.92 | −0.24 | −2.1 | 6.6 |
| E13 | 0.9 | 0.1 | | 0.8 | | 0.2 | 471.8 | 5036 | 2.3 | −2.18 | −2.62 | −2.4 | 6.9 |
| E14 | 0.7 | 0.3 | | 0.7 | 0.3 | | 460.4 | 2327 | 1.4 | 7.25 | −7.94 | −0.35 | 6.8 |
| E15 | 0.3 | 0.7 | | 0.7 | 0.3 | | 408.1 | 849 | 0.3 | 5.27* | 2.58* | 3.93* | 6.4 |
| E16 | 0.3 | 0.7 | | 0.5 | 0.5 | | 414.3 | 6820 | 1.0 | 2.09* | −3.11* | −0.51* | 8.2 |
| E17 | 1 | | | 1 | | | 475.0 | 6672 | 2.5 | −8.03 | −6.22 | −7.12 | 8.3 |
| E18 | 0.9 | 0.1 | | 1 | | | 468.6 | 3871 | 2.2 | −0.23 | 1.45 | 0.61 | 8.0 |

*CTE values of CE7, E15 and E16 measured over 50-450° C. since $T_g$'s are less than 450° C.

TABLE 2

|  |  | Example | | | |
| --- | --- | --- | --- | --- | --- |
|  |  | E1 | E2 | CE10 | E16 |
| BHM copper | μm | 12 | 12 | 12 | 12 |
| Dielectric thickness | μm | 23.6 | 19.3 | 27.0 | 27.0 |
| Peel strength 90 deg, AR | N/mm | 0.12 | 0.13 | 0.25 | 0.24 |
| Peel strength 90 deg, AS | N/mm | 0.13 | 0.13 | 0.23 | 0.28 |
| $D_k$, AR | @10 GHz | 4.46 | 4.34 | 3.75 | 3.82 |
| $D_f$, AR | @10 GHz | 0.0215 | 0.0276 | 0.0129 | 0.0133 |
| $D_k$, 23° C./50% | @10 GHz | 4.80 | 4.70 | 3.80 | 3.97 |
| $D_f$, 23° C./50% | @10 GHz | 0.0392 | 0.0426 | 0.0201 | 0.0191 |
| $D_k$, 85° C./85% | @10 GHz | 5.12 | 4.98 | 4.01 | 4.07 |
| $D_f$, 85° C./85% | @10 GHz | 0.0489 | 0.0506 | 0.0290 | 0.0242 |
| CTE (MD), from clad | ppm/° C. | −3.73 | −2.70 | 7.3 | 2.2 |
| CTE (TD), from clad | ppm/° C. | 1.62 | 2.01 | 9.4 | 0.5 |
| CTE (MD), from film | ppm/° C. | 0.50 | 1.9 | −6.1 | −9.7 |
| CTE (TD), from film | ppm/° C. | −0.63 | 1.85 | −1.8 | −1.8 |
| Modulus (film) | GPa | 9.6 | 8.6 | 7.8 | 8.2 |

Examples E19 and E20

For Examples 19 and 20 (E19 and E20), the compositions PMDA 1.0//DAPBI 1.0 (E19) and PMDA 0.9/BPDA 0.1//DAPBI 1.0 (E20) were prepared following the procedure of E1, but varying the ratio of dianhydride to diamine while maintaining a solids content of 16 wt %. Table 3 shows the change in viscosity of the PAA solutions as the molar ratio of dianhydride to diamine is varied from 0.80:1 to 0.985:1.

TABLE 3

| Example | Dianhydride:Diamine | Viscosity after 1 hr stirring (Poise) | Temp (° C.) |
| --- | --- | --- | --- |
| E19 | 0.80:1 | 19.20 | 24.0 |
|  | 0.85:1 | 24.32 | 24.7 |
|  | 0.90:1 | 62.72 | 26.5 |
|  | 0.95:1 | 302.1 | 33.0 |
|  | 0.95-0.97:1 | 300-500 | 27.0 |
|  | 0.97-0.985:1 | 2000-3000 | 27.0 |
| E20 | 0.80:1 | 19.20 | 24.4 |
|  | 0.85:1 | 23.04 | 24.9 |
|  | 0.901 | 58.85 | 27.0 |
|  | 0.95:1 | 392.5 | 33.9 |
|  | 0.95-0.97:1 | 300-500 | 27.0 |
|  | 0.97-0.985:1 | 2000-3000 | 27.0 |

By controlling the viscosity and solids content of PAA solutions or vanish forms used to form polyimide films, flexible films with high $T_g$, low CTE and high tensile modulus could be readily made when the dianhydride to diamine monomer molar ratio was in a range of from 0.85:1 to 0.99:1.

Note that not all of the activities described above in the general description are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose. Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A polyimide film comprising a polyimide derived from a dianhydride and a diamine, wherein:
    the dianhydride comprises pyromellitic dianhydride;
    the diamine comprises a benzimidazole;
    the molar ratio of dianhydride to diamine that forms the polyimide is in a range of from 0.85:1 to 0.99:1; and
    the polyimide film has a Tg of 400° C. or higher, a tensile modulus of 6.0 GPa or more, and a coefficient of thermal expansion of 15 ppm/° C. or less over a temperature range of 50 to 500° C.

2. The polyimide film of claim 1, wherein the dianhydride further comprises up to 70 mole percent of 3,3',4,4'-biphenyltetracarboxylic dianhydride, 2,3,3',4'-biphenyltetracarboxylic dianhydride, or a mixture thereof, based on the total dianhydride content of the polyimide.

3. The polyimide film of claim 1, wherein the benzimidazole is selected from the group consisting of 5-amino-2-(4-aminophenyl)benzimidazole, 5-amino-2-(3-aminophenyl)benzimidazole, 6,6'-bis[2-(4-aminobenzene)benzimidazole], [2,2'-bi-1H-benzimidazole]-6,6'-diamine and mixtures thereof.

4. The polyimide film of claim 1, wherein the diamine further comprises a benzoxazole.

5. The polyimide film of claim 4, wherein the benzoxazole is selected from the group consisting of 5-amino-2-(4-aminophenyl)benzoxazole, 2,2'-p-phenylenebis[5-aminobenzoxazole], [2,2'-bibenzoxazole]-5,5'-diamine, 2,6-(4,4'-aminophenyl)benzobisoxazole and mixtures thereof.

6. The polyimide film of claim 1, wherein the diamine further comprises up to 50 mole percent of p-phenylenediamine, m-phenylenediamine, m-tolidine, or a mixture thereof, based on the total diamine content of the polyimide.

7. The polyimide film of claim 1, further comprising a crosslinking agent, a colorant, a matting agent, submicron particles or a mixture thereof.

8. The polyimide film of claim 1, wherein the polyimide film has a thickness in a range of from 4 to 150 μm.

9. An electronic device comprising the polyimide film of claim 1.

10. The electronic device of claim 9, wherein the polyimide film is used in device components selected from the group consisting of thin-film transistor substrates, substrates for color filter sheets, cover films and metal-clad laminates.

\* \* \* \* \*